United States Patent
Lammers et al.

(10) Patent No.: US 8,421,487 B2
(45) Date of Patent: Apr. 16, 2013

(54) METHOD FOR EXTENDING THE DIAGNOSTIC CAPABILITY OF CURRENT REGULATORS

(75) Inventors: Christian Lammers, Stuttgart (DE); Jochen Neumeister, Stuttgart (DE); Hans Raub, Appelcross (AT); Steffen Reinhardt, Pforzheim (DE); Danilo Marcato, Pforzheim (DE)

(73) Assignee: Robert Bosch GmbH, Stuttgart (DE)

( * ) Notice: Subject to any disclaimer, the term of this patent is extended or adjusted under 35 U.S.C. 154(b) by 598 days.

(21) Appl. No.: 12/308,196

(22) PCT Filed: Apr. 30, 2007

(86) PCT No.: PCT/EP2007/054215
§ 371 (c)(1),
(2), (4) Date: Oct. 6, 2009

(87) PCT Pub. No.: WO2008/000539
PCT Pub. Date: Jan. 3, 2008

(65) Prior Publication Data
US 2010/0164516 A1    Jul. 1, 2010

(30) Foreign Application Priority Data

Jun. 27, 2006   (DE) .......................... 10 2006 029 389

(51) Int. Cl.
*G01R 27/08*    (2006.01)

(52) U.S. Cl.
USPC ........................ 324/704; 324/691; 324/71.5

(58) Field of Classification Search .................. 324/71.6
See application file for complete search history.

(56) References Cited

U.S. PATENT DOCUMENTS

| | | | |
|---|---|---|---|
| 5,245,522 A * | 9/1993 | Kawaguchi et al. | 363/37 |
| 5,579,236 A * | 11/1996 | Tamamura et al. | 702/64 |
| 2005/0156581 A1 * | 7/2005 | Sutardja et al. | 323/268 |

FOREIGN PATENT DOCUMENTS

| | | |
|---|---|---|
| DE | 36 16 975 | 11/1987 |
| DE | 38 42 921 | 6/1990 |
| DE | 43 44 013 | 3/1995 |
| DE | 198 51 732 | 5/1999 |
| DE | 101 24 109 | 12/2002 |
| JP | 11-327666 | 11/1999 |

OTHER PUBLICATIONS

JP 11-327666, Machine Translation, p. 1-14.*
DE 198 51 732, Machine Translation, p. 1-23.*

* cited by examiner

Primary Examiner — Thomas Valone
(74) Attorney, Agent, or Firm — Kenyon & Kenyon LLP

(57) ABSTRACT

A method and a device for monitoring at least one output stage for an inductive load using a current regulator and an analysis device are described. A short circuit to a power supply or to ground is detected by comparing at least one current value in a switching phase of the at least one output stage with at least one current value in a free-wheeling phase of the at least one output stage.

9 Claims, 5 Drawing Sheets

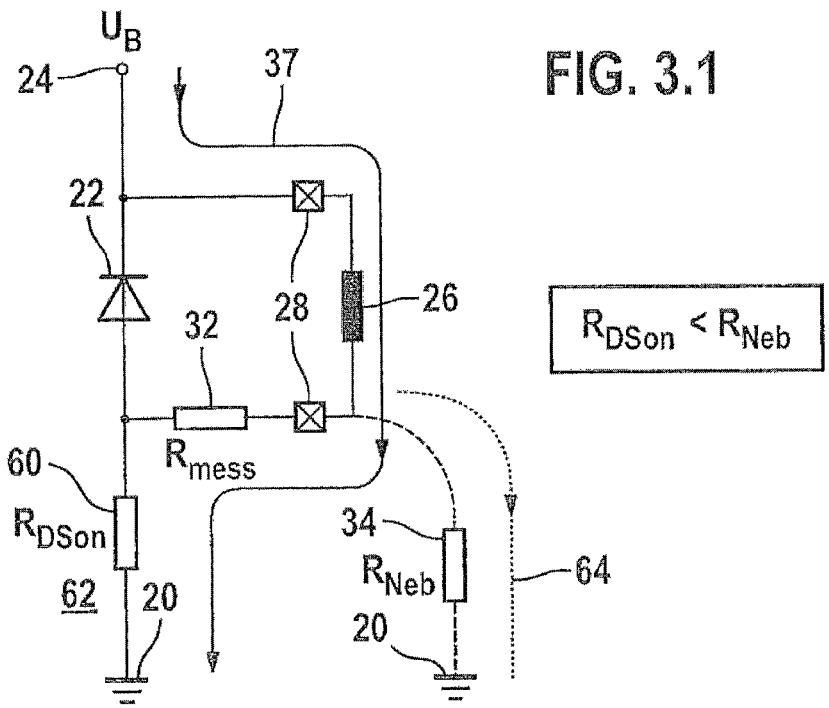
FIG. 3.1
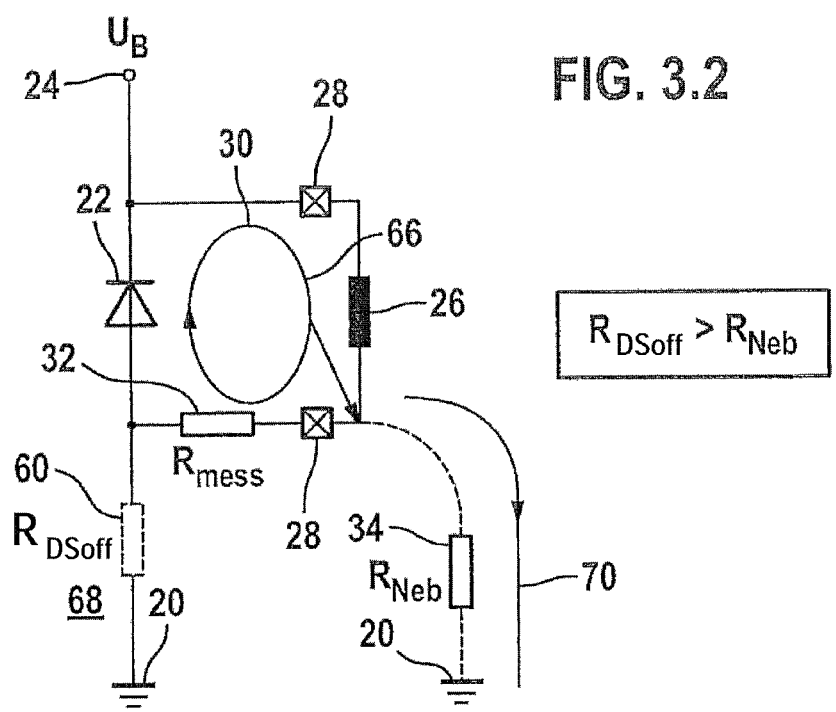
FIG. 3.2

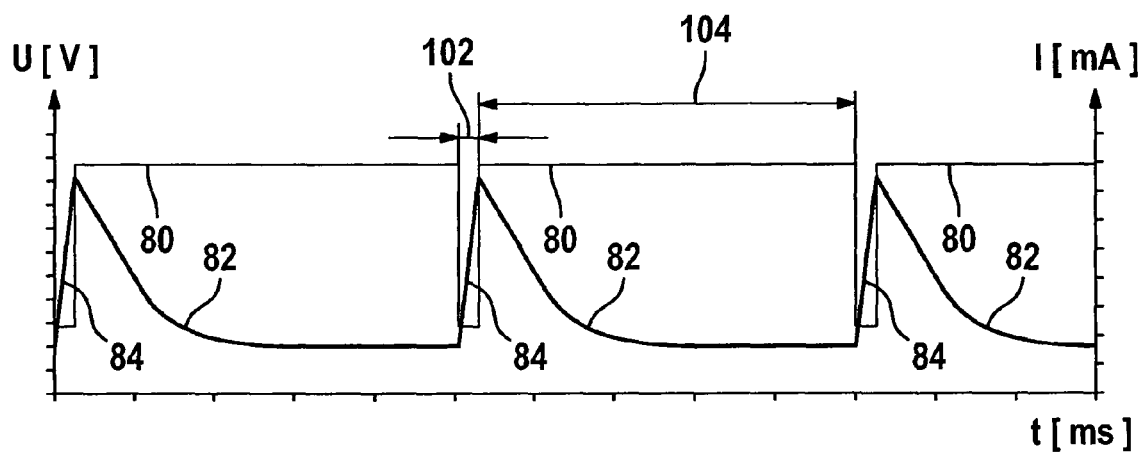
FIG. 4.1
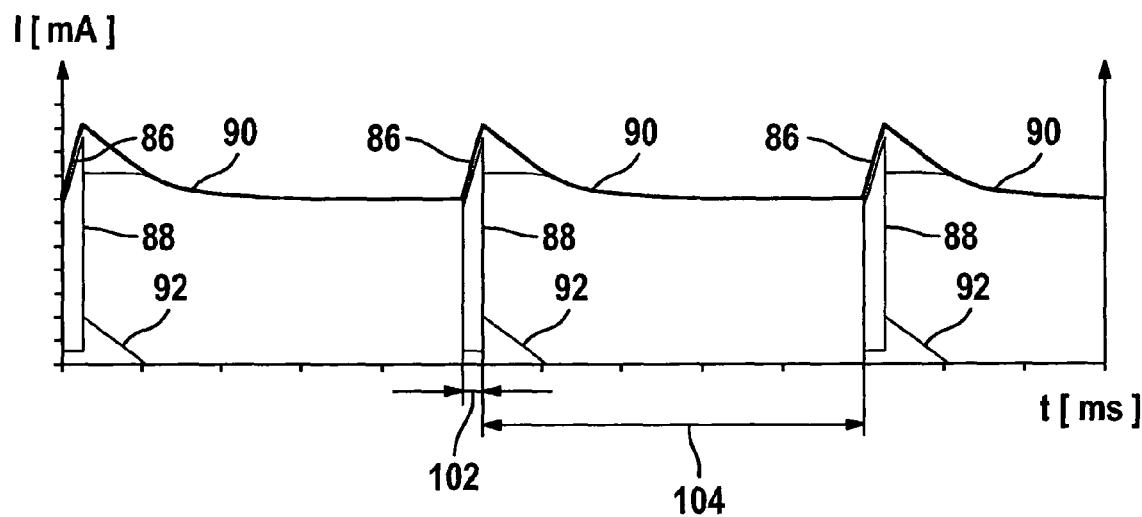
FIG. 4.2

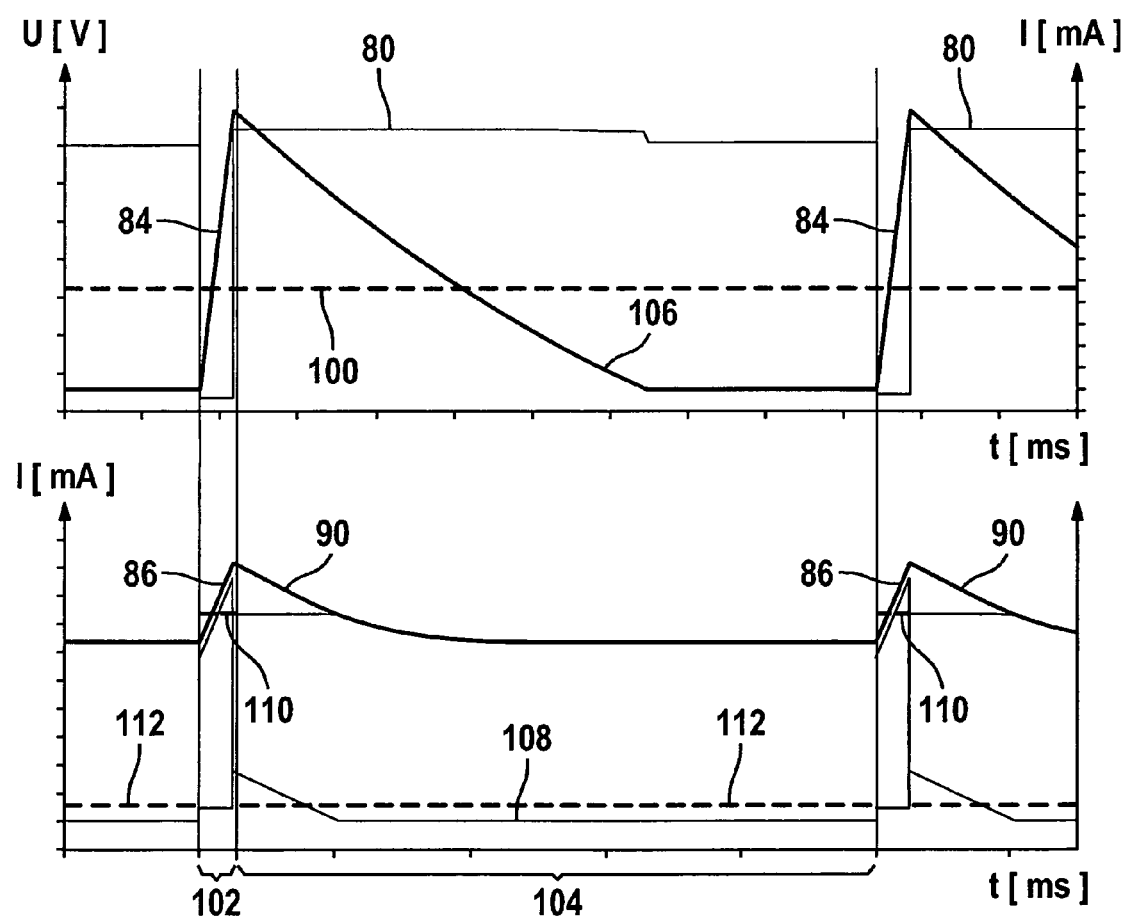

METHOD FOR EXTENDING THE DIAGNOSTIC CAPABILITY OF CURRENT REGULATORS

FIELD OF THE INVENTION

The present invention relates to a method for extending the diagnostic capability of current regulators.

BACKGROUND INFORMATION

Electronic switching output stages may be tested for defects by diagnostic methods. Electronic switching output stages may be tested for a drop in load in which no load current occurs, for an underload in which the load current that occurs is too low, for an overload in which the load current that occurs is too high, and for a short circuit to ground and a short circuit to the power supply. In addition, the electronic switching output stage is usually diagnosed to determine whether there is an excess temperature. In the diagnostic method presented here, a distinction is made between high-side switches (HS) and low-side switches (LS).

Within the scope of the diagnostic methods listed above, the fault may be detected under the prerequisites indicated below:

With respect to the high-side output stage, diagnosis for a drop in load with the output stage turned on or off is performed by applying a test current or applying a test potential. The diagnosis for a drop in load is performed by a measurement at a shunt and/or by a voltage measurement on the load.

Diagnosis for an underload of the electronic switching output stage is usually performed with the output stage on by measuring the voltage drop at a shunt.

Diagnosis for an overload is usually also performed with the output stage on by measuring the voltage drop at a shunt and/or measuring an on-resistance of the output stage.

Diagnosis of the electronic switching output stage for short circuit to ground (low resistance or high resistance) is usually performed with the output stage on via a voltage drop at the shunt and/or by ascertaining an on-resistance of the output stage. The diagnosis with regard to a short circuit to power supply ($U_{bat}$), whether it is low resistance or high resistance, is usually performed with the output stage off by applying a test current or a test potential on the basis of a voltage measurement at the load, whereas within the scope of the diagnostic methods listed above, an excess temperature measurement is always performed usually via a temperature measurement by ascertaining the diode voltage. Alternatively, a temperature-dependent resistance may be measured.

With respect to the low side of the electronic switching output stage, a drop in load is diagnosed with the output stage turned on or off by applying a test current or a test potential. The measurement method used is usually to measure the voltage drop at a shunt and/or to measure an on-resistance of the output stage and to measure the voltage of the load.

Diagnosis with regard to the underload applied to the electronic switching output stage is performed with the output stage on by measuring the voltage drop at a shunt. The same thing also applies to diagnosis of an overload. A short circuit to ground (low resistance, high resistance) is diagnosed with the output stage off by applying a test current or a test potential, usually by a voltage measurement at the load. A short circuit to power supply ($U_{bat}$), whether low resistance or high resistance, is diagnosed with the output stage on by measuring the voltage at the shunt, whereas as in the case of the excess temperature measurement of the high side of the output stage, an excess temperature measurement is always performed for which purpose a temperature measurement by ascertaining the diode voltage or a temperature-dependent resistance may be used.

The diagnostic methods described above have the disadvantage in the case of clocked output stages and inductive loads that when the output stage is off, the voltage measurement at the load functions only to a limited extent during clocking. This means that, for example, high-resistance shunts parallel to the output stage are not able to be detected because the inductive load determines the potential at the load in the free-wheeling phase with the free-wheeling diode and the shunt.

German patent document DE 198.51 732 A1 discusses a method and a device for monitoring at least one current regulating stage. According to the method from DE 198 51 732 A1, at least one current regulating stage for an electrical consumer is monitored by a device which includes at least one switching arrangement and one current regulator. A current, which is determined by a pulse duty factor, flows through the at least one consumer, the current being able to be regulated to a setpoint value by the current regulator. For monitoring, the pulse duty factor and/or a variable derived from the pulse duty factor are/is compared with a threshold value, and when there is a deviation from this threshold value, the existence of a fault is detected. Instead of the pulse duty factor, a ratio between the pulse duty factor and the setpoint value may be formed and compared with a comparison value. Starting from the pulse duty factor and the voltage, a current value may be determined and compared with a comparison value.

The diagnostic method of an electronic switching output stage, which is known from the related art and is outlined above, as well as the approach from DE 198 51 732 A1, are both subject to the disadvantage that during pulse-width-modulated operation of electronic switching output stages, high-resistance short circuits to the power supply or to ground are detectable only to a limited extent.

SUMMARY OF THE INVENTION

The approach proposed according to the exemplary embodiments and/or exemplary methods of the present invention describes a diagnostic method which will allow detection of high-resistance shunts, e.g., parallel to the switch, in the case of a clocked electronic output stage with an inductive load. To do so, one or more current values in the switching phase is/are compared with the current value(s) in the free-wheeling phase, thus allowing detection of a shunt. This is true of detection of a shunt to ground as well as detection of a shunt to power supply $U_{bat}$.

The analysis is based on the fact that the current through the inductive load is distributed differently between the shunt resistor and the current through a measuring resistor $R_{mess}$ when the output stage is on or off. With the output stage on, shunt resistor $R_{neben}$ and the resistors for current measurement $R_{mess}$ together with on-resistor $R_{Dson}$ of the output stage form a parallel circuit. The shunt resistor to be detected here is relatively greater than the sum of the other two resistors, so that almost all current flows through measuring resistor $R_{mess}$.

When the output stage is off, the current is divided between a free-wheeling circuit and the shunt resistor. In this case, the current through the shunt resistor is not much smaller and may be determined during the free-wheeling phase as:

$$I_{shunt} = \frac{\text{battery voltage} + \text{free-wheeling diode voltage drop}}{\text{shunt resistance}}$$

$$I_{shunt} = \frac{\text{battery voltage}}{\text{shunt resistance} + \text{ohmic load component}}$$

where $I_{free\text{-}wheeling\ diode}=0$.

Different current waveforms through the measuring resistor may be analyzed using the following approaches. During averaging, the current average with the output stage on is compared with the current average with the output stage off. All conventional methods may be used for averaging, e.g., analog and digital integration methods. A fault current occurs when the averages differ. Troubleshooting may then be performed using a delta wave.

As an alternative to averaging, individual current interpolation points may be analyzed. Depending on the required precision in the analysis, the distance between the lines is variable. However, it should be taken into account that one detection instant occurs during the on-phase and one detection instant occurs during the off-phase. A detection instant may also include averaging over individual values.

In addition to the analysis methods presented, averaging and analysis of individual current interpolation points, an analysis may also be performed based on a surge in the current characteristic. A fault current produces a sudden change in curve shape. An analysis may be performed via methods using derivative properties or in digital systems via slopes between detected sample values.

The exemplary embodiments and/or exemplary methods of the present invention is described in greater detail below on the basis of the drawings.

BRIEF DESCRIPTION OF THE DRAWINGS

FIG. 1 shows a circuit diagram with the current paths drawn in.

FIG. 3.1 shows the current path with the output stage on, $R_{Dson}<R_{Neb}$.

FIG. 3.2 shows the current path with the output stage off, $R_{DSon}>R_{Neb}$.

FIG. 4.1 shows the current waveform without a shunt resistor.

FIG. 4.2 shows the current waveform with a shunt resistor.

FIG. 5 shows the analysis using the averaged current.

DETAILED DESCRIPTION

Figure 1:
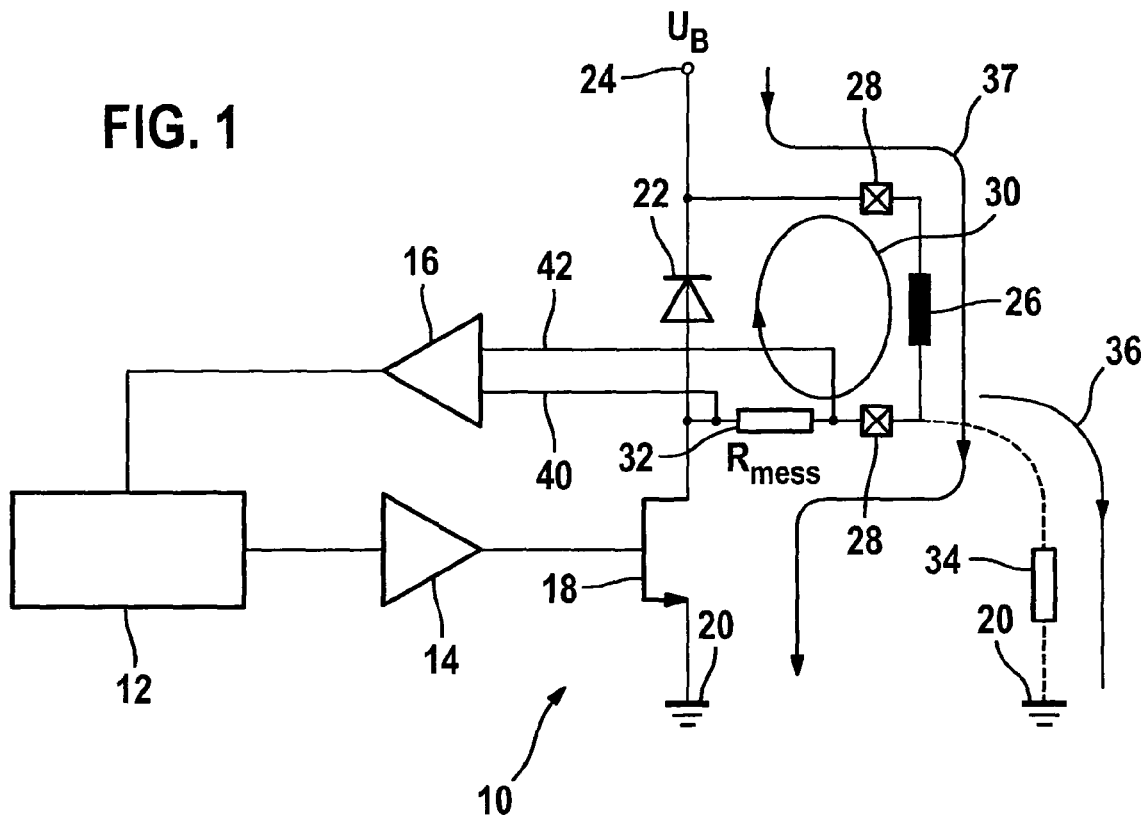

The diagram according to FIG. 1 schematically shows an overview of the circuit with the current paths drawn in.

The diagram in FIG. 1 shows a diagnostic circuit 10, which includes a regulator 12. Regulator 12 may be implemented as software in a processor or may also be designed as a module. A driver 14 which triggers an output stage 18 is connected downstream from regulator 12. Regulator 12 is also connected to an analysis device 16, which receives a first tap 40 and a second tap 42, which are closed upstream or downstream from a measuring resistor $R_{mess}$, reference numeral 32. The output stage has a connection to ground 20. In addition, a free-wheeling circuit includes a free-wheeling diode 22. Load 26 is in particular a load having an inductive component, e.g., a coil of a pressure regulator or another add-on component. Load 26 is connected to the free-wheeling circuit at terminals 28. A free-wheeling current 30 runs in the free-wheeling circuit for the case when at least one output stage 18 is off. Reference numeral 34 denotes a shunt resistor $R_{Neb}$; current $I_{Neb}$ running through shunt resistor 34 is labeled with reference numeral 36. The load current is labeled with reference numeral 37.

Additional diagnoses that may be performed in diagnostic circuit 10 are implementable by independent blocks and are disregarded below. For the principle of the expanded current diagnosis proposed according to the present invention, implementation of regulator 12 is of subordinate importance and may be implemented as software in a processor or as a module, as already mentioned above.

Figure 2:
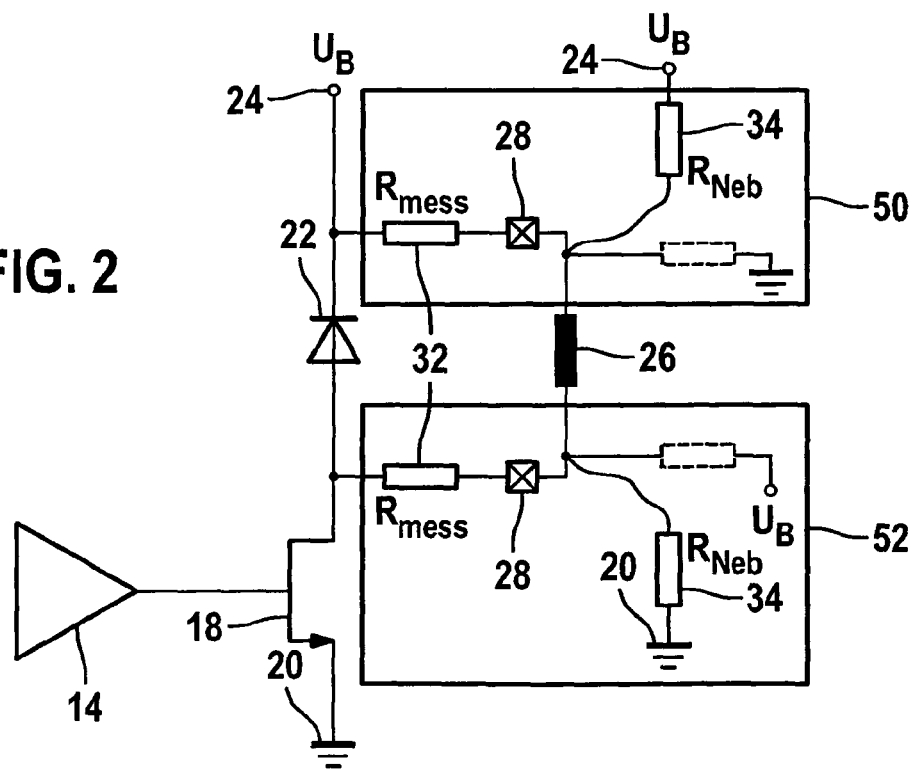
FIG. 2 shows placement options for measuring resistor $R_{mess}$ in the circuit according to the diagram in FIG. 1.

FIG. 2, to be described in greater detail below, indicates that measuring resistor $R_{mess}$ 32 may be used both upstream and downstream from load 26, which is a load having an inductive component in particular. The difference between the two possible placements of measuring resistor $R_{mess}$ 32 is based on whether a spring current that is not corrected is to be detected by a "soft" shunt to battery voltage $U_{bat}$ 24 or to ground 20. The following statements in conjunction with the other figures refer to the detection of a soft shunt resistor 34 to ground 20. The same approach may be used for a shunt to a battery, i.e., to $U_{bat}$. Short circuits to ground 20 and to $U_{bat}$ may be detected with the method proposed here.

The diagram according to FIG. 2 shows that, as illustrated in the upper part of FIG. 2, measuring resistor $R_{mess}$ 32 may be installed in a first position 50. In this case, the measuring resistor is connected downstream from the conducting side of free-wheeling diode 22. This case is described in greater detail below.

The diagram according to FIG. 2 also shows that measuring resistor $R_{mess}$, see reference numeral 32, may be situated in a second position 52, i.e., may be situated between free-wheeling diode 22 and the at least one output stage 18. For both placement options 50 and 52 of the measuring resistor, currents through shunt resistors 34 not situated within the particular rectangular fields also flow through measuring resistor $R_{mess}$ 32 and are corrected. These currents do not result in an increase in current through load 26, which is an inductive load in particular. The diagram according to FIG. 2 shows a detail of diagnostic circuit 10 shown in FIG. 1 but it does not show all the components thereof.

The resulting current paths with the output stage on and off are shown in the diagrams according to FIGS. 3.1 and 3.2.

For the diagram according to FIG. 3.1, an on-resistor $R_{Dson}<R_{Neb}$ applies.

In the diagram according to FIG. 3.1, the at least one output stage 18 is on, as indicated by reference numeral 62. The resulting on-resistor is indicated by reference numeral 60 and $R_{DSon}$. In on-state 62 of the at least one output stage 18, shunt resistor $R_{Neb}$ and the resistors for current measurement $R_{mess}$ and on-resistor $R_{DSon}$ of the at least one output stage 18 form a parallel circuit. In this state, shunt resistor $R_{Neb}$ to be detected is relatively greater than the sum of the other two resistors, i.e., greater than the sum of $R_{mess}$ and $R_{Dson}$ so that almost the entire current flows across measuring resistor $R_{mess}$ see numeral 32. Reference numeral 37 denotes the load current.

With output stage 62 on according to the diagram in FIG. 3.1, the current flow through the shunt resistor is thus of a negligible order of magnitude. In the diagram according to FIG. 3.1, measuring resistor $R_{mess}$, see reference numeral 32, is indicated by reference numeral 52 in FIG. 2.

The diagram in FIG. 3.2 shows the current path with the output stage off. For the state shown in FIG. 3.2, it holds that RDSoff >RNeb. For the case in question here, which refers to the second position of measuring resistor Rmess reference numeral 32, indicated with reference numeral 52 in FIG. 2, the at least one output stage 18 is off, as indicated by reference numeral 68 and by resistor RDS, represented by the dotted lines, reference numeral 60. For this case a free-wheeling current 30 is established. In off-state 68 of the at least one output stage 18, the current is divided between the free-wheeling circuit and shunt resistor 34, as indicated in FIG. 3.2. In this case, current INeb may be determined as follows during the free-wheeling phase:

For the case in which the current in free-wheeling diode 22, $I_{free-wheeling\ diode} \neq 0$, this yields:

$$I_{Neb} = \frac{U_{bat} + U_{FD}}{R_{neb}}$$

where $U_{FD}$ is the voltage drop across the free-wheeling diode.

For the case in which the current in the free-wheeling diode is $I_{free-wheeling\ diode}=0$, this yields shunt current $$I_{shunt} = \frac{U_{Bat}}{R_{Neb} + \text{ohmic component load}}.$$

In state 62 shown in FIG. 3.1, i.e., with output stage 62 on, almost the entire current flows across measuring resistor $R_{mess}$, the current flow through shunt resistor 34 being almost negligible while the current flow through shunt resistor 34 is on the order of magnitude of free-wheeling current 30 in the diagram according to FIG. 3.2, i.e., with the at least one output stage 18 off, see reference numeral 68, depending on the size of the shunt resistor. The current flow through shunt resistor 34 is indicated by reference numeral 70 in the diagram according to FIG. 3.2, while in the diagram according to FIG. 3.1 a negligible current through shunt resistor 34 with output stage 18 on is indicated by reference numeral 64.

The voltage characteristics established across the output stage and the resulting currents through load 26 may be derived from FIGS. 4.1 and 4.2.

In the diagram according to FIG. 4.1 which refers to the current waveform without a shunt resistor, the voltage characteristic across the at least one output stage 18 is indicated by reference numeral 80. The current established across load 26 corresponding to the state depicted in FIG. 3.1 is indicated by reference numeral 82. An inductive component represented by a first rising flank 84 is characteristic of the current through load 82. Since the current flowing across shunt resistor 34 is negligible according to the current path depicted in FIG. 3.1 with the at least one output stage 18 on, this is omitted in the diagram according to FIG. 4.1. FIG. 4.1, belonging to on-state 62 of the at least one output stage 18, shows current 82 through load 26, corresponding to the current through measuring resistor $R_{mess}$, see reference numeral 32 in FIG. 3.1.

The diagram according to FIG. 4.2, showing the current waveform with a shunt resistor indicates accordingly that, with output stage 18 off, see reference numeral 68 in FIG. 3.2, voltage characteristic 88 across the at least one output stage 18 is indicated by reference numeral 88. The resulting current through load 26 is indicated by curve 90 when a shunt resistor is present. According to the diagram in FIG. 4.1, current 82 through load 26 corresponds to the current flowing through measuring resistor $R_{mess}$ 32 while the current flowing through measuring resistor $R_{mess}$, reference numeral 32 according to the diagram in FIG. 4.2, is indicated by reference numeral 92. Current 90 flowing through load 26 in FIG. 4.2 is characterized by a much shorter second rising flank 86 in comparison with the diagram according to FIG. 4.1. In the diagram according to FIG. 4.2, the current flowing through shunt resistor 34 corresponds to the voltage characteristic across output stage 88.

From a comparison of the current characteristics through measuring resistor $R_{mess}$, reference numeral 32 in FIGS. 3.1 and 3.2, it is apparent that in the absence of a shunt resistor, virtually all current flows through measuring resistor $R_{mess}$, reference numeral 32, this current corresponding to curve 82 in the diagram according to FIG. 4.1, whereas when shunt resistor 34 is present, the current flowing across it is much larger. In the case of the state with the shunt resistor illustrated in FIG. 4.2, current 92 flowing across measuring resistor $R_{mess}$ 32 is much lower.

Figure 6:
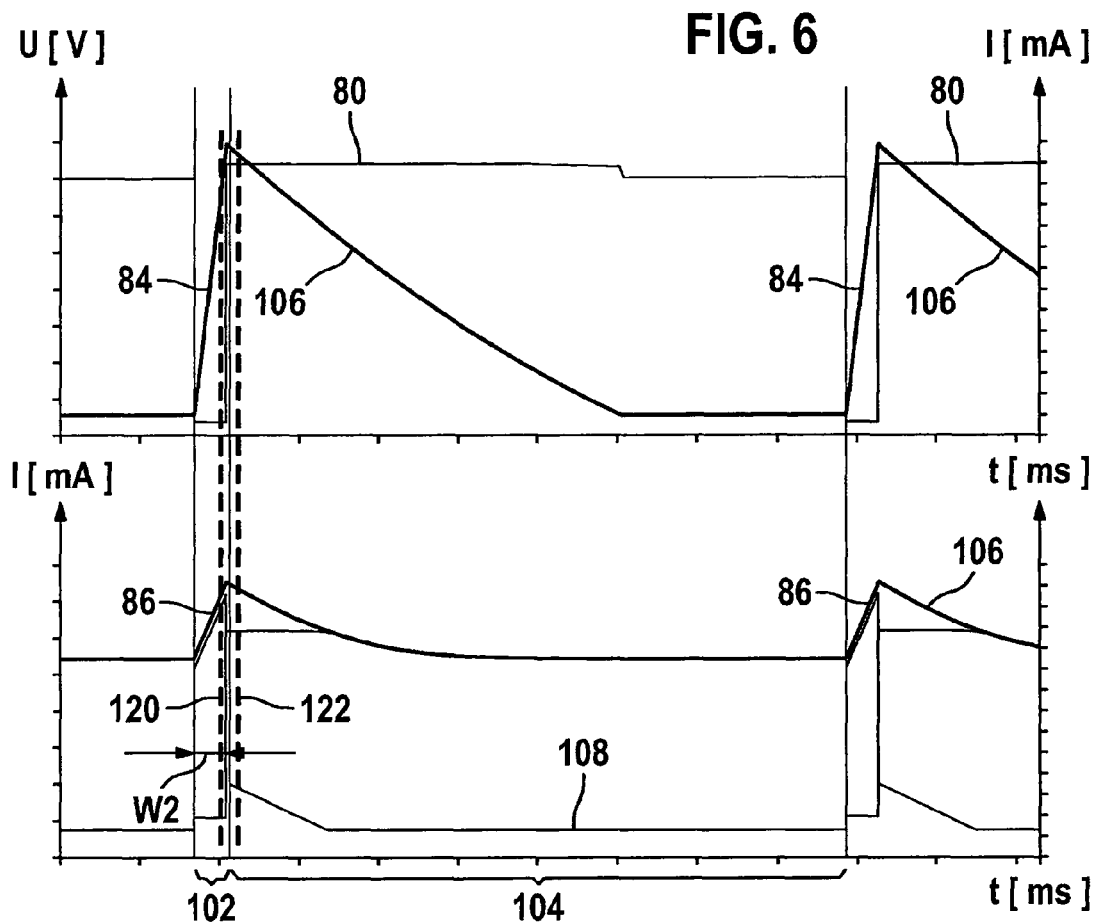
FIG. 6 shows the analysis by evaluation of individual current values.
Figure 7:
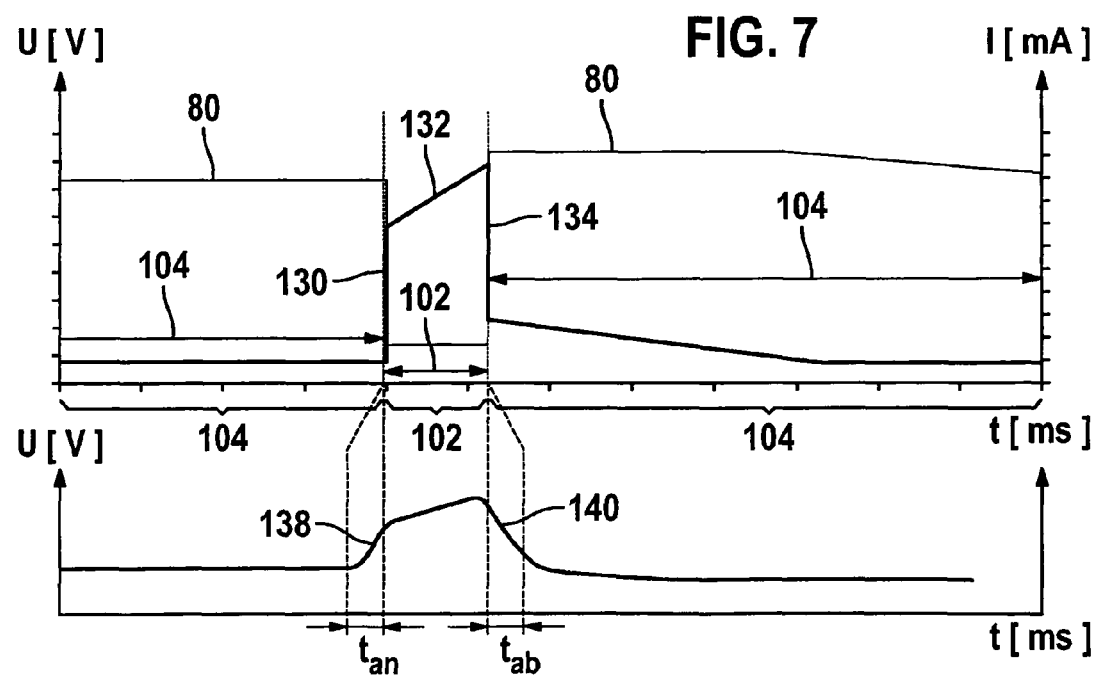
FIG. 7 shows the analysis via detection of surges in the resulting current profile.

Analysis methods of the different current waveforms with and without a shunt resistor as illustrated in FIGS. 4.1 and 4.2 are compared with the following diagrams according to FIGS. 5, 6 and 7.

The diagram according to FIG. 5 shows that the currents through measuring resistor $R_{mess}$, see reference numeral 32, correspond to the characteristic of current 82 through load 26 without shunt resistor 34, indicated by reference numeral 106 in FIG. 5, and when the shunt resistor is present, the current corresponds to curve 108.

In the first case, the resulting average of the current through measuring resistor $R_{mess}$, see reference numeral 32 in FIGS. 3.1 and 3.2, is indicated by reference numeral 100; in the latter case, the average current flowing through measuring resistor $R_{mess}$ 32 with output stage 18 on is represented by reference numeral 110 and with the output stage off is represented by reference numeral 112. In the diagram according to FIG. 5, the at least one output stage 18 is on during on-time 102 and is off during an off-time 104. With respect to load 26, the rising flanks established during on-time 102 of output stage 18 are identified by reference numerals 84 and 86, which correspond to rising flanks 84 and 86 established in conjunction with FIGS. 4.1 and 4.2, respectively.

The averaging takes place by comparison of current averages 100, 110, 112 in on-state 62 of the at least one output stage with the current average of the output stage in off-state 68. Averaging according to the diagram in FIG. 5 may be performed by any conventional method, e.g., by analog and digital integration methods. A fault current is present when the averages differ and fault detection may be performed based on a delta threshold.

FIG. 6 shows an analysis of individual current interpolation points of the currents established with and without a shunt resistor.

FIG. 6, like FIG. 5, shows the on-time of the at least one output stage 18 by reference numeral 102, while the at least one output stage 18 is off during off-time 104. The diagram according to FIG. 6 shows that a first sampling time 120 occurs before the switching of the at least one output stage 18 while a second sampling time 122 occurs after the switching of output stage 18. As in the diagram according to FIG. 5, curves 106 and 108 denote the current flow established in each case through measuring resistor $R_{mess}$ (see reference numeral 32 in FIGS. 3.1 and 3.2). Sampling times 120 and 122 logically occur during the on-phase of output stage 18 and during the off-phase thereof. When there is no shunt resistor, the characteristic of first current 106 through this (resistor) is detected with respect to the measuring resistor at first sampling time 120 and at second sampling time 122, whereas when the shunt is present, resulting second current flow 108, which is much lower than in the former case, through measuring resistor $R_{mess}$ is detected during sampling times 120 and 122, whereby in the absence of a shunt resistor, the current flowing across measuring resistor $R_{mess}$ corresponds to the current flowing through load 26, which may be an inductive load in particular. The method proposed here may also be applied in the transition from off-time 104 to on-time 102 of output stage 18.

A diagram according to FIG. 7 shows a current surge analysis. Without knowledge of the switch state, according to this analysis method, at least one current surge 130 or 134 in the current through measuring resistor $R_{mess}$ is detected, a flank-shaped current rise 132 occurring between first current surge 130 and second current surge 134. During current surges 130 and 134, voltage characteristic 80 is established across output stage 18. Current surges 130, 134 occur at the start of on-time 102 of the output stage and after the end thereof.

However if output stage 18 is off, see reference numeral 62 in FIGS. 3.1 and 3.2, no current surge is established.

A sudden change in current flow is detected on the basis of a fault current, namely in the present case a current across a shunt resistor. An analysis may be performed via methods having derivative properties or, in the case of digital systems, via slopes between the particular surge values recorded. Current surges 130 and 134 occur when the output stage is being activated or deactivated, therefore at the start of on-time 102 and at its end. In an analysis via integrating methods, the flanks of current surges 130, 134 may be blurred, so the resulting gradients are to be filtered out of the signal. FIG. 7 shows resulting current waveforms 138, 140 in integrating or differentiating methods. A rise time $t_{an}$ and a drop time $t_{ab}$ represent information about the resulting shunt resistance. The dotted lines indicate the chronological assignment to current surges 130, 134.

What is claimed is:

1. A method for monitoring at least one output stage for an inductive load having a current regulator of an analysis device, the method comprising:
   calculating at least one first current value of a current flowing through a current measurement resistor $R_{mess}$ in a switching phase of the at least one output stage, wherein the current measurement resistor $R_{mess}$ is coupled to an on-resistor $R_{DSon}$, both of which are coupled in parallel to a shunt resistor $R_{neb}$;
   calculating at least one second current value of a current flowing through the current measurement resistor $R_{mess}$ in a free-wheeling phase of the at least one output stage;
   comparing the at least one first current value to the at least one second current value; and
   detecting a shunt to one of a power supply and a ground based on the comparing.

2. The method of claim 1, wherein the shunt is detected based on a division of a current between the shunt resistor and the current measurement resistor in both the switching phase and the free-wheeling phase as measured at the current measurement resistor.

3. The method of claim 2, wherein the shunt resistor is substantially larger than the sum of the on-resistor and the measuring resistor, and a total current flows through the measuring resistor.

4. The method of claim 2, wherein the current is divided between a free-wheeling current and a shunt resistance current when the at least one output stage is in a deactivated state.

5. The method of claim 4, wherein a shunt current $I_{Neb}$ flowing through shunt resistor is determined during a free-wheeling phase by either $$I_{Neb} = \frac{U_{bat} + U_{FD}}{R_{Neb}}$$

where $U_{FD}$=voltage drop across the free-wheeling diode, and $I_{free-wheeling\ diode} \neq 0$ or by $$I_{Neb} = \frac{U_{bat}}{R_{Neb} + R_{Load}}$$

where $R_{Load}$ is the ohmic load component, and $I_{free-wheeling\ diode}=0$.

6. The method of claim 2, wherein current $I_{Neb}$ flowing through shunt resistor $R_{Neb}$ is determined by $$I_{Neb} = \frac{U_{FD}}{R_{Neb}} \text{ or } I_{Neb} = \frac{U_{Bat} - U_{RDson}}{R_{Neb}}$$

where $U_{RDson} \triangleq$ voltage drop across the activated output stage.

7. The method of claim 1, wherein the current resulting at measurement resistor is analyzed in an analysis device by at least one of averaging, analyzing individual interpolation points and by detecting at least one current surge.

8. A diagnostic circuit for monitoring at least one output stage for an inductive load, comprising:
   a current regulator;
   at least one measuring resistor coupled to an on-resistor, the at least one measuring resistor and the on-resistor coupled in parallel to a shunt resistor; and
   an analysis device to compare a first current flowing through the at least one measuring resistor in a switching phase to a second current flowing through the at least one measuring resistor in a free wheeling phase;
   wherein the inductive load of the at least one measuring resistor is connected one of upstream in a first position and downstream in a second position.

9. The diagnostic circuit of claim 8, wherein the analysis device is at least one of implemented as software in a processor and as a module, and the measuring resistor is a shunt.

* * * * *

UNITED STATES PATENT AND TRADEMARK OFFICE
CERTIFICATE OF CORRECTION

PATENT NO.       : 8,421,487 B2
APPLICATION NO.  : 12/308196
DATED            : April 16, 2013
INVENTOR(S)      : Lammers et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1073 days.

Signed and Sealed this
Eighth Day of September, 2015

Michelle K. Lee
*Director of the United States Patent and Trademark Office*